(12) United States Patent
Krone

(10) Patent No.: US 7,729,675 B2
(45) Date of Patent: Jun. 1, 2010

(54) REDUCING NOISE DURING A GAIN CHANGE

(75) Inventor: Andrew W. Krone, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 649 days.

(21) Appl. No.: 11/635,973

(22) Filed: Dec. 8, 2006

(65) Prior Publication Data
US 2008/0137784 A1 Jun. 12, 2008

(51) Int. Cl.
H04B 1/06 (2006.01)
H04Q 7/20 (2006.01)

(52) U.S. Cl. .................... 455/234.1; 375/345

(58) Field of Classification Search .............. 455/232.1, 455/234.1, 234.2, 240.1–242.2, 245.1, 251.1, 455/253.2; 375/345
See application file for complete search history.

(56) References Cited

U.S. PATENT DOCUMENTS 4,397,040 A * 8/1983 Jandel et al. ............... 455/219
5,451,948 A * 9/1995 Jekel ......................... 341/139
2003/0083031 A1* 5/2003 Eriksson et al. ........... 455/250.1
2003/0143967 A1* 7/2003 Ciccarelli et al. ......... 455/232.1
2007/0081615 A1 4/2007 Khoini-Poorfard et al. .. 375/345

OTHER PUBLICATIONS

Silicon Labs, "Si4730/31 Broadcast AM/FM Radio Receiver," Feb. 14, 2007, pp. 1-2.
U.S. Appl. No. 11/636,021, filed Dec. 8, 2006, entitled "Providing Channel Filtering In An Automatic Frequency Control Path," by Andrew W. Krone.

* cited by examiner

*Primary Examiner*—Lee Nguyen
(74) *Attorney, Agent, or Firm*—Trop, Pruner & Hu, P.C.

(57) ABSTRACT

In one embodiment, the present invention includes a method for injecting a gain compensation value into a signal path of a receiver for a predetermined time when a change to a control value for an amplifier of the receiver occurs. This gain compensation value may be used to at least substantially remove a gain change caused by the change to the control value, improving audio performance by reducing or removing audible artifacts caused by the gain change.

23 Claims, 6 Drawing Sheets

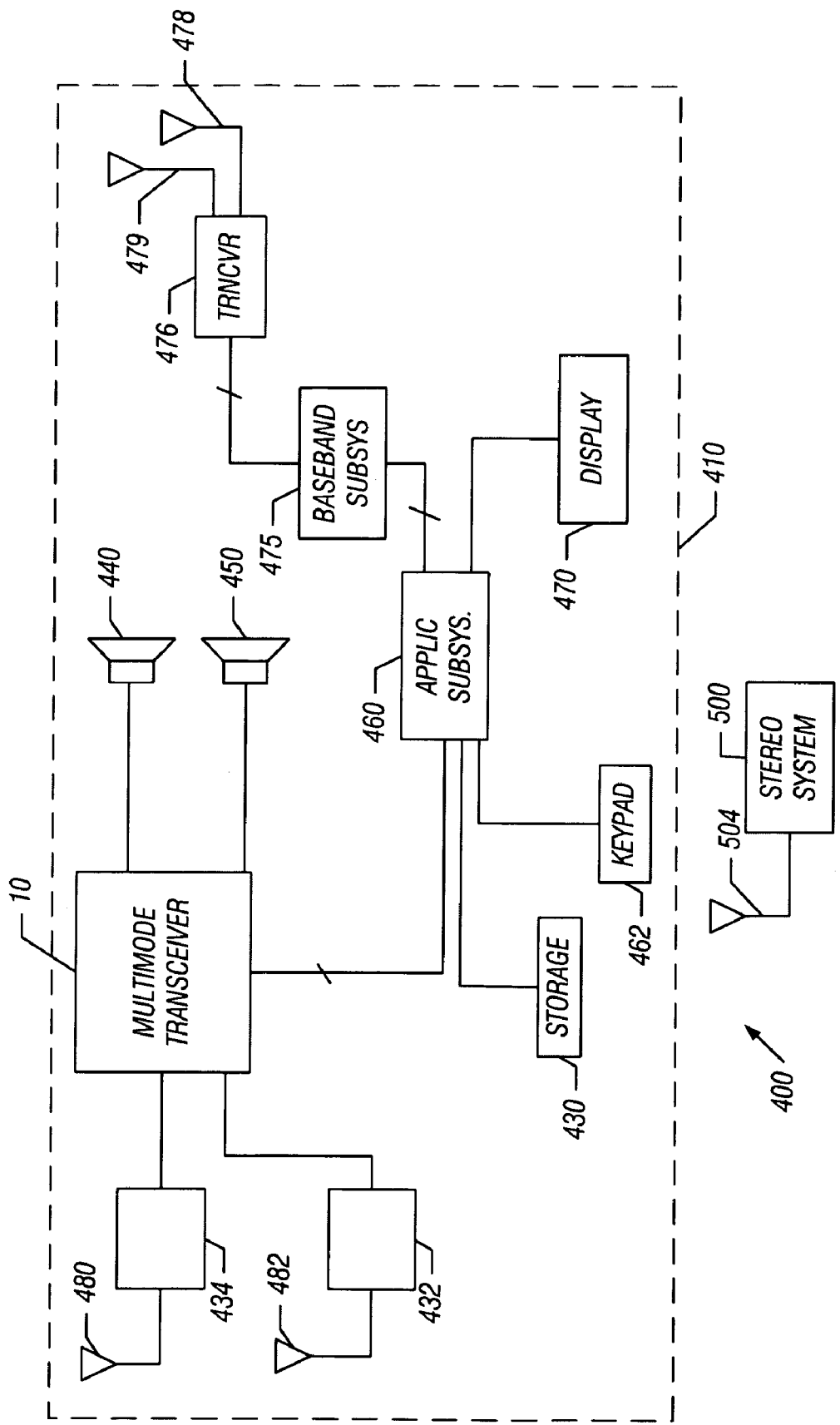

US 7,729,675 B2

REDUCING NOISE DURING A GAIN CHANGE

FIELD OF THE INVENTION

Embodiments of the present invention relate to radios, and more particularly to such radios including an amplitude modulation (AM) receiver.

BACKGROUND

Radio receivers such as AM and frequency modulation (FM) receivers are well known and are pervasive. Conventionally, these receivers have been formed of analog circuitry to receive an incoming radio frequency (RF) signal, downconvert the signal, and demodulate the downconverted signal to obtain an audio signal for output. Typically, the circuitry for AM and FM receivers, even in a combined radio, includes separate dedicated paths for AM and FM operation. While such analog-based circuitry may perform well, the area associated with this analog circuitry typically exceeds that used for digital circuitry, and the analog receivers typically include many discrete components. In contrast, digital circuitry is generally available in ever-decreasing sizes, as the benefits of advanced semiconductor processes provide for greater integration benefits. Furthermore, the cost of digital integrated circuits (ICs) is generally less than corresponding analog circuitry.

Accordingly, some radio receivers are being designed to incorporate greater amounts of digital circuitry. While such circuitry may improve performance and can be formed in small packages, typically there are complexities in processing RF signals that require significant digital processing to match the relatively simple circuitry of an analog receiver.

Additional issues exist in radio receivers. Some radio receivers include circuitry such as an automatic gain control (AGC) circuit to adjust an output level to an appropriate reference level. Because the incoming signal for an AM receiver is an AM modulated signal, any gain changes that occur rapidly (i.e., within the audible bandwidth of approximately 100 Hertz (Hz)-20 kHz) may produce undesirable noise such as in the form of audible artifacts, clicks and so forth. Accordingly, AGC circuits generally adjust gain continuously and slowly.

A receiver can include multiple amplifiers or other gain blocks, both analog and digital, within different portions of a signal processing path. While control for digital gain blocks can be adjusted slowly enough to reduce audible artifacts below a desired level, changes to analog gain blocks may occur instantaneously, producing undesired audible artifacts. Using numerous small steps that can be slowly controlled to adjust analog gain blocks may reduce these audible artifacts. However, such designs lead to excessive complexity and control, increased die size and greater power consumption.

SUMMARY OF THE INVENTION

In one aspect, the present invention includes a method for improving audio response of a radio receiver in the presence of a gain change occurring in the receiver. In one such embodiment, a gain compensation value may be injected into a signal path of a receiver for a predetermined time when a change to a control value for an amplifier of the receiver occurs. This gain compensation value may be used to at least substantially remove a gain change caused by the change to the control value. While many manners of generating such a gain compensation value may exist, in one embodiment a compensation signal may be provided to a filter having an output that is used to generate the gain compensation value. The gain compensation value may be controlled from an initial value to a predetermined final value at which the gain change is allowed to propagate along the signal path to a digital gain block.

Another aspect of the present invention is directed to an apparatus that includes a front end amplifier to adjust a level of an incoming radio signal, an analog-to-digital converter (ADC) coupled to the front end amplifier to digitize the incoming radio signal and provide it to a signal path, and a gain compensation input coupled to the signal path to provide a gain change compensation signal to remove a level change present in the incoming radio signal after a change to a control value for the front end amplifier. The gain compensation may be generated in different manners. For example, in one embodiment circuitry or programmable logic may be used that includes a first summer to sum a compensation signal with a feedback signal, a delay element coupled to an output of the first summer, and a second summer coupled between an output of the delay element and the gain compensation input. In some implementations, a single controller may be used to generate both the control value for the front end amplifier and the compensation signal.

While embodiments may be implemented in many different forms, in one embodiment an apparatus may take the form of an integrated circuit (IC) including a digital demodulator, a programmable amplifier, and the gain compensation described above. Such an IC may be configured in a system as a receiver to receive an AM signal, where the receiver has a first amplifier controllable by a first control value to amplify the AM signal, a mixer to downconvert the AM signal to a second frequency signal, a digitizer to digitize the second frequency signal, a gain compensator to generate a compensation value based on a change to the first control value, a combiner to combine the outputs of the digitizer and the gain compensator, and an automatic volume controller (AVC) to receive the combiner output and provide an output signal at a substantially constant volume. In one embodiment, the gain compensator and the AVC may be implemented in a digital signal processor (DSP).

BRIEF DESCRIPTION OF THE DRAWINGS

FIG. 6 is a block diagram of a wireless system in which embodiments of the present invention may be used.

DETAILED DESCRIPTION

In various embodiments, compensation for an instantaneous change to a control value for an analog gain block due to, e.g., changing signal conditions may be provided. More specifically, a gain compensation mechanism may be implemented to inject a gain compensation signal into a signal processing path to essentially remove the instantaneous gain change. That is, a substantially equal and opposite gain change may be effected via the gain compensation mechanism to remove the instantaneous gain change. Then, this gain compensation mechanism may slowly decay the gain compensation value so that the desired gain change slowly takes effect, reducing or removing audible artifacts. While the scope of the present invention is not limited in this regard, in various implementations different combinations of hardware, firmware and/or software may be used to perform gain change compensation. Accordingly, this gain compensation value may then be controlled in a time-varying manner to slowly allow the desired gain change to take effect without undesired audible artifacts.

While the scope of the present invention is not limited in this regard, in some embodiments an AM receiver may be implemented using a substantial amount of digital circuitry, and an entire AM receiver may be implemented on a single integrated circuit (IC) having both analog front-end circuitry to receive and downconvert an incoming RF signal, as well as digital circuitry such as a digital signal processor (DSP) or other digital circuitry to process the baseband signal to obtain a demodulated output. Furthermore, in some implementations an AM receiver may be combined in a single IC (e.g., on the same monolithic die) with an FM receiver/transmitter (i.e., transceiver). In such embodiments, a substantial amount of circuitry for both AM and FM reception modes, as well as for FM transmission, may be reused. In some implementations, to effect such operations a single set of receiver circuitry may be provided, and a different firmware image may be selected for operation in an AM or FM mode. Owing to the relatively small size of such an IC, embodiments may be configured for use in portable devices, such as cellular telephones, personal media players such as MP3 players and personal digital assistants (PDAs), although the scope of the present invention is not limited in this regard.

Figure 1:
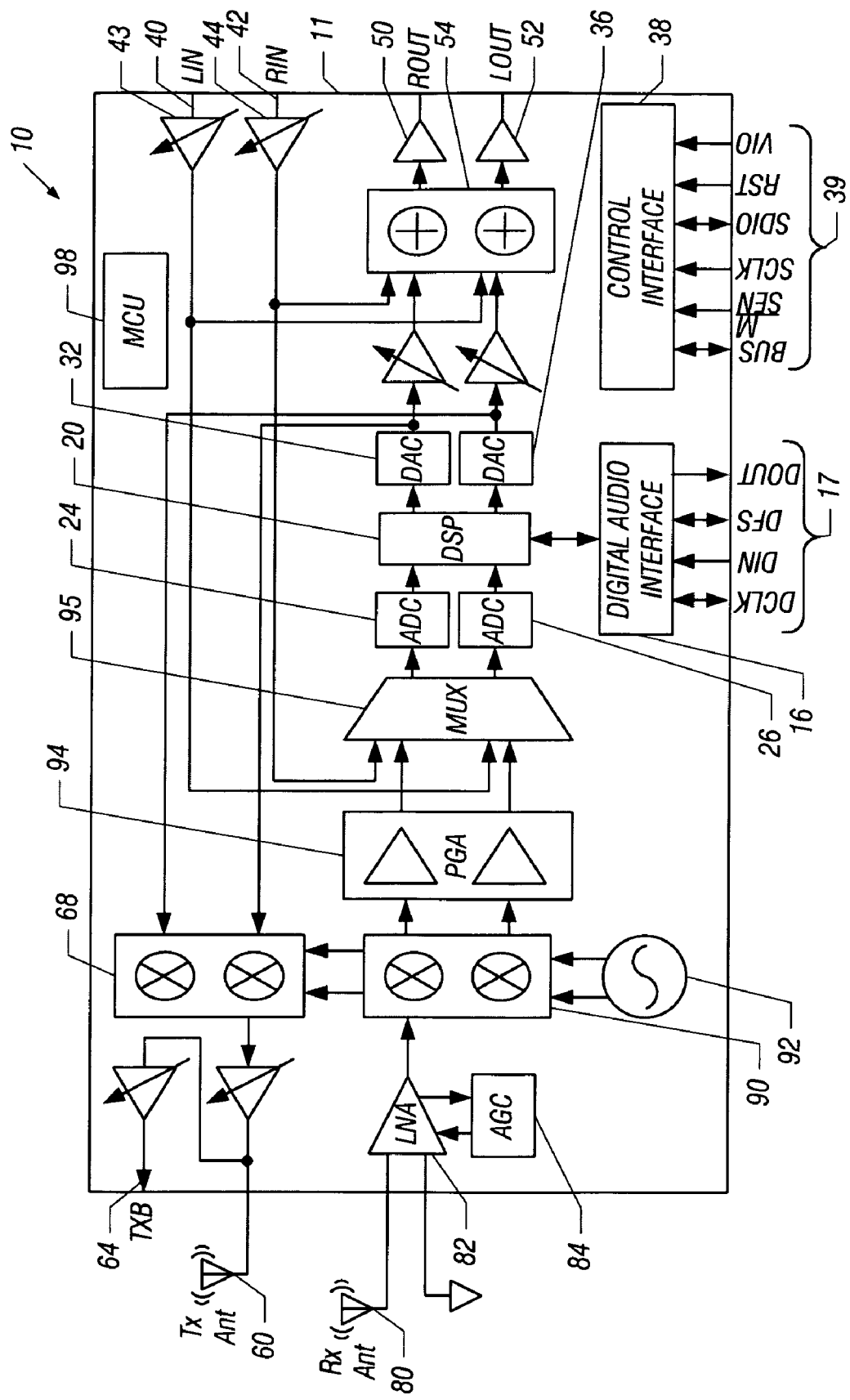
FIG. 1 is a block diagram of a multimode transceiver in accordance with an embodiment of the present invention.

Referring now to FIG. 1, in accordance with embodiments of the invention described herein, a multimode combined AM/frequency modulation (FM) transceiver 10, which may be fabricated on a monolithic semiconductor die 11, has several different signal processing modes of operation, in which the transceiver 10 may perform FM transmission, AM or FM reception, analog mixing, digital mixing and codec functions. More specifically, as described herein, the multimode FM transceiver 10 has an FM transmit mode in which the transceiver 10 functions as an FM transmitter; an AM or FM receive mode in which the transceiver 10 functions as a receiver; and an audio mode in which the transceiver 10 functions as a codec. In each of these modes of operation, the multimode transceiver 10 may perform various analog and/or digital mixing functions. Additionally, in accordance with some embodiments of the invention, the multimode transceiver 10 includes a digital audio interface 16, which allows the communication of digital audio signals between the transceiver 10 and circuitry ("off-chip" circuitry, for example) that is external to the transceiver 10.

In accordance with embodiments of the invention the FM transmit, AM and FM receive and audio modes are orthogonal in that the multimode transceiver 10 is in only one of the modes at a time. However, it is understood that in other embodiments of the invention, the multimode transceiver may operate in two or more of the modes concurrently. In general, the multimode transceiver 10 may receive one or more of the following input source signals in accordance with some embodiments of the invention: a digital audio signal (called "DIN"), which is received through the digital audio interface 16; an incoming RF signal that is received from an external receive antenna 80; a digital audio band signal that is received from the digital audio interface 16; and left channel (called "LIN") and right channel (called "RIN") analog stereo channel signals that are received at input terminals 40 and 42, respectively.

Depending on the particular configuration of the multimode transceiver 10, the transceiver 10 is capable of mixing two or more of its input source signals together to generate one or more of the following output signals: an outgoing FM transmission signal to drive an external transmit antenna 60; left channel (called "LOUT") and right channel (called "ROUT") analog stereo signals that appear at output terminals 52 and 50, respectively; and a digital output signal (called "DOUT") that is routed through the digital audio interface 16. In accordance with some embodiments of the invention, the multimode transceiver 10 may also provide a low impedance RF transmission output signal (called "TXB") at an output terminal 64 for purposes of driving a low impedance load.

The multimode transceiver 10 may reuse some of its hardware components for purposes of reducing the complexity and size of the transceiver 10, as well as reducing the overall time that may be consumed in designing the transceiver 10. For example, in accordance with some embodiments of the invention, a digital signal processor (DSP) 20 of the multimode transceiver 10 performs both digital FM modulation (for the FM transmit mode) and digital AM and FM demodulation (for the receive mode) for the transceiver 10. As another example of the hardware reuse, analog-to-digital converters (ADCs) 24 and 26 of the multimode transceiver 10 perform transformations between the analog and digital domains for both complex (when the transceiver 10 is in the receive mode) and real (when the transceiver 10 is in the transmit mode) signals. Additionally, the ADCs 24 and 26 may be used in the audio mode for purposes of digitizing the LIN and RIN stereo channel signals.

As another example of hardware reuse by the multimode transceiver 10, in accordance with some embodiments of the invention, digital-to-analog converters (DACs) 32 and 36 of the transceiver 10 convert digital audio band signals from the digital to the analog domain for both the receive and audio modes. The DACs 32 and 36 are also used during the FM transmit mode for purposes of converting intermediate frequency (IF) band signals from the digital to the analog domain.

Turning now to the overall topology of the multimode transceiver 10, the transceiver 10 includes a multiplexer 95 for purposes of routing the appropriate analog signals to the ADCs 24 and 26 for conversion. For example, the multiplexer 95 may select an incoming analog IF signal during the receive mode and select the LIN and RIN stereo channel signals during the FM transmit and audio modes. The digital signals that are provided by the ADCs 24 and 26 are routed to the DSP 20.

For the receive modes, the multimode transceiver 10 provides incoming signals from the receive antenna 80 to a low noise amplifier (LNA) 82 that may have a gain controlled by an AGC circuit 84. The intensity-adjusted signals may be provided to analog mixers 90 that are coupled to a tunable local oscillator 92, the frequency of which selects the desired radio channel to which the transceiver 10 is tuned. In response to the incoming RF signal, the mixers 90 produce corresponding analog IF, quadrature signals that pass through programmable gain amplifiers (PGAs) 94 before being routed to the ADCs 24 and 26. While not shown for ease of illustration in the embodiment of FIG. 1, understand that PGAs 94 may have a gain controlled by the AGC circuit 84.

Because PGAs 94 may have their gain instantaneously changed in a manner that could cause audible artifacts, in some implementations the AGC circuit 84 may further include or be coupled to gain compensation circuitry to enable elimination or reduction of such audible artifacts. Furthermore, understand that the AGC circuit 84 may further include control circuitry to enable control of digital gain blocks that may be present in the DSP 20. Using the AGC circuit 84 and techniques in accordance with an embodiment with an embodiment of the present invention, instantaneous gain changes in LNA 82 and/or PGAs 94 may be tracked out and slowly implemented so that audible artifacts are removed or reduced.

As further shown in FIG. 1, the ADCs 24 and 26 convert the analog IF quadrature signals from the PGAs 94 into digital signals, which are provided to the DSP 20. The DSP 20 demodulates the received complex signal to provide corresponding digital left and right channel stereo signals at its output terminals; and these digital stereo signals are converted into the analog counterparts by the DACs 32 and 36, respectively. As described further below, mixing may then be performed by mixers, or analog adders 54, which provide the ROUT and LOUT stereo signals at the output terminals 50 and 52, respectively. It is noted that the digital demodulated stereo signals may also be routed from the DSP 20 to the digital audio interface 16 to produce the DOUT digital signal.

In the FM transmit mode of the multimode transceiver 10, the content to be transmitted over the FM channel (selected by the frequency of the local oscillator 92, for example) may originate with the DIN digital data signal, the LIN and RIN stereo channel signals or a combination of these signals. Thus, depending on whether the analog signals communicate some or all of the transmitted content, the multimode transceiver 10 may use the ADCs 24 and 26. The DSP 20 performs FM modulation on the content to be transmitted over the FM channel to produce digital orthogonal FM signals, which are provided to the DACs 32 and 36 to produce corresponding analog orthogonal FM signals, which are in the IF range. Analog mixers 68 (which mix the analog orthogonal FM signals with a frequency that is selected by the local oscillator 92) of the multimode transceiver 10 frequency translate and combine the signals to produce an RF FM signal that is provided to the transmit antenna 60. In the audio mode of the multimode transceiver 10, the DSP 20 may be used to perform digital mixing. Analog mixing in the audio mode may be performed using the adder 54.

Among the other features of the multimode transceiver 10, in accordance with some embodiments of the invention, the transceiver 10 includes a control interface 38 for purposes of receiving various signals 39 that control the mode (FM transmit, AM or FM receive or audio) in which the transceiver 10 is operating, as well as the specific submode configuration for the mode, as further described below. For example, different firmware present in the DSP 20 may be executed based on the selected mode of operation. In accordance with some embodiments of the invention, the multimode FM transceiver 10 may also include a microcontroller unit (MCU) 98 that coordinates the general operations of the transceiver 10, such as configuring the ADCs 24 and 26 and DACs 32 and 36, configuring data flow through the multiplexer 95, or the like.

Figure 2:
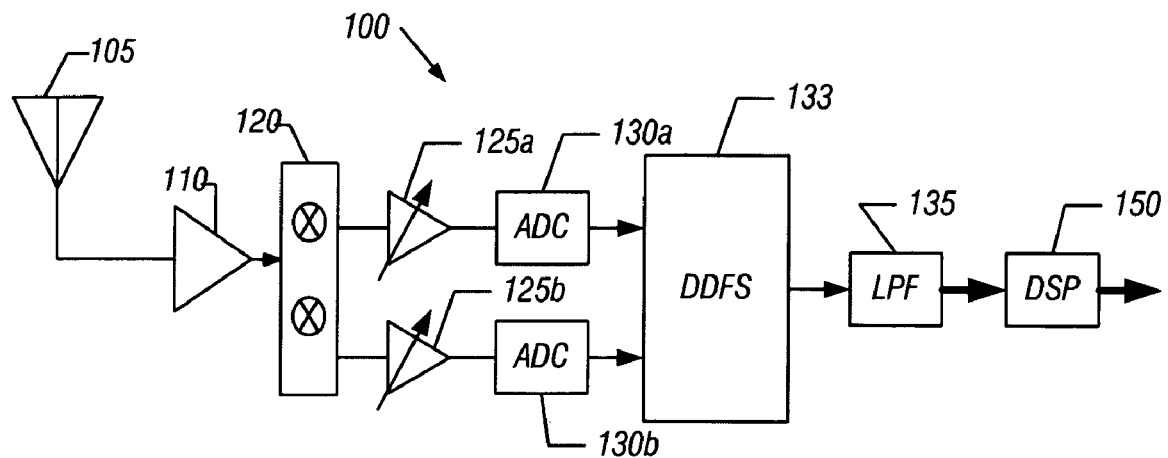
FIG. 2 is a block diagram of an AM receiver in accordance with an embodiment of the present invention.

While embodiments may be implemented in many different receiver architectures, referring now to FIG. 2, shown is a block diagram of a signal processing path of a receiver in accordance with one embodiment of the present invention. As shown in FIG. 2, an AM receiver 100 may be implemented via the various components of transceiver 10 described above, although the scope of the present invention is not limited in this aspect. As shown in FIG. 2, receiver 100 is used to receive and process an incoming AM signal. Receiver 100 includes an antenna 105 to receive an RF signal and provide it to a low noise amplifier (LNA) 110. The output of LNA 110 is provided to a complex mixer 120 which generates in-phase (I) and quadrature (Q) signals therefrom. While not shown in the embodiment of FIG. 2, in various implementations mixer 120 may be controlled by an output of a voltage controlled oscillator (VCO) or a numerically controlled oscillator (NCO). Complex mixer 120 may mix the incoming RF signals down to a low IF value, in some embodiments. In other implementations however, a receiver may be of a direct downconversion architecture in which incoming RF signals are directly downconverted into baseband signals. The complex outputs of mixer 120 may be amplified in PGAs 125a and 125b. PGAs 125a and 125b may operate based on AGC to output a signal of substantially steady gain, in some embodiments. In various instances, incoming signals to PGAs 125a and 125b may be provided with positive gain (i.e., amplification) or negative gain (i.e., attenuation), based on different conditions. In turn, the output of PGAs 125a and 125b may be provided to corresponding ADCs 130a and 130b. The outputs of ADCs 130a and 130b may be provided to a direct digital frequency synthesizer (DDFS) 133 that may generate a downmixed baseband complex signal, which may in turn be filtered via a low pass filter (LPF) 135.

As shown in FIG. 2, the filtered complex signal may then be provided to a digital signal processor (DSP) 150. DSP 150 may be used to perform various signal processing on the filtered complex signal. For example, DSP 150 may perform digital-based demodulation. Furthermore, DSP 150 may be controlled to perform digital AGC functions associated with one or more digital gain blocks within DSP 150. For ease of illustration in this high level block diagram of FIG. 2, the output signal of DSP 150 may correspond to an AM demodulated signal. However, understand that DSP 150 may perform further signal processing based on the incoming signal. Such processing may include power analysis, adjacent channel analysis, further filtering, other control mechanisms and so forth. Furthermore, while not shown for ease of illustration in FIG. 2, circuitry within DSP 150 or a separate processor may be used to perform other control functions. Still further, in some implementations DSP 150 may include circuitry and/or code to perform AGC operations in accordance with an embodiment of the present invention. Understand further that while shown in the high level block diagram of FIG. 2 as outputting an AM demodulated signal, in other modes of operation DSP 150 or other portions of receiver 100 may perform FM modulation and demodulation, among other signal processing operations.

Figure 3:
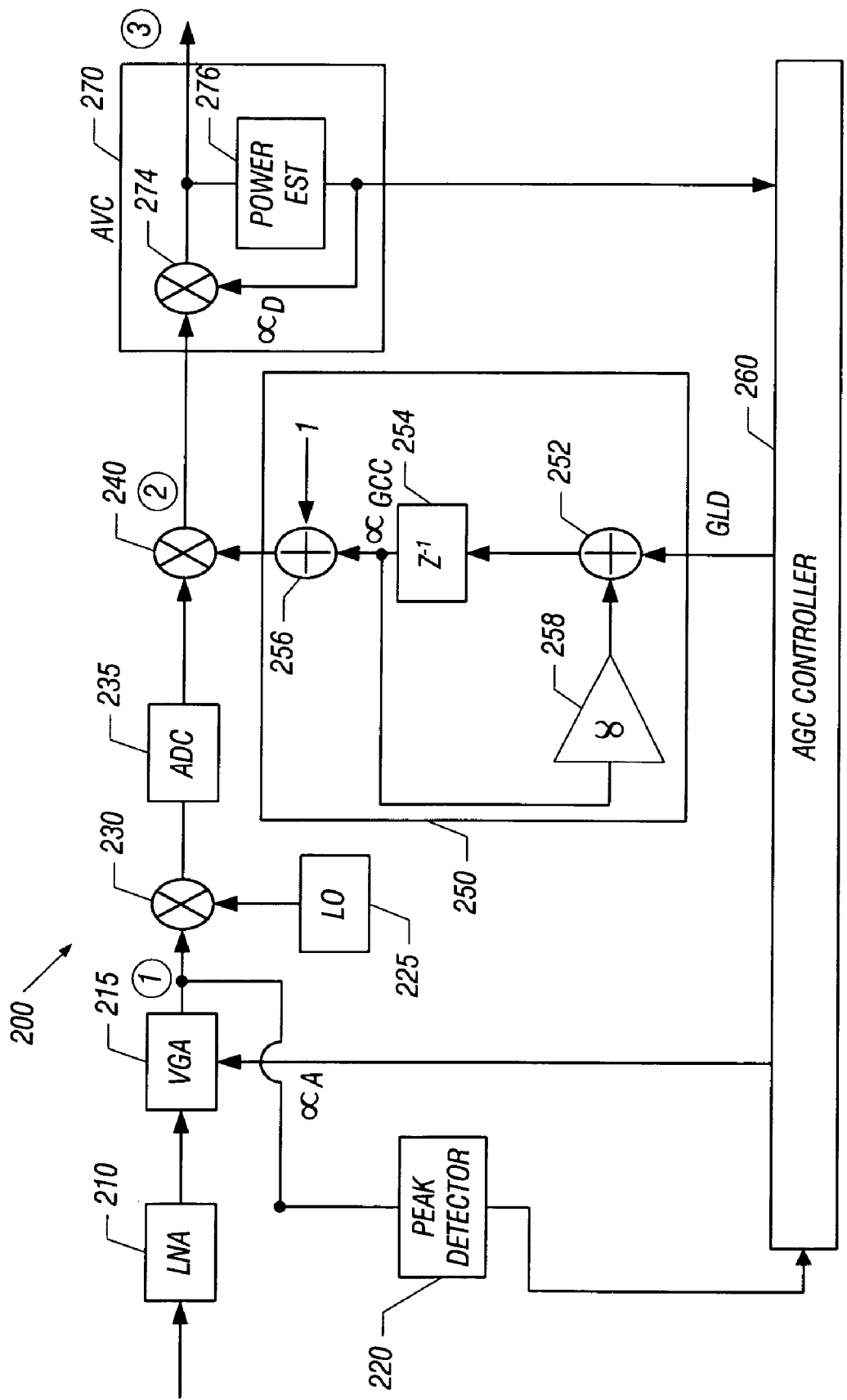
FIG. 3 is a block diagram of a portion of a receiver in accordance with an embodiment of the present invention.

Referring now to FIG. 3, shown is a block diagram of a portion of a receiver in accordance with an embodiment of the present invention. More specifically, FIG. 3 shows a receiver 200 that includes a gain change compensation circuit coupled to a signal processing path. As shown in FIG. 3, an incoming RF signal is provided to a LNA 210. The amplified signal is then provided to a VGA 215 that may be controlled by a control signal, $\alpha_A$, received from an AGC controller 260. Based on a given value of $\alpha_A$, VGA 215 provides a desired level of gain to the received signal. Depending on the signal level, this gain may be positive (i.e., amplification) or negative (i.e., attenuation) in a dB sense, and in a magnitude sense the gain may be always positive. The adjusted signal is then provided to a mixer 230, which may be a complex mixer to mix the RF signal with a frequency value from a local oscillator (LO) 225. In various embodiments, mixer 230 may downmix the RF signal to IF, although the scope of the present invention is not limited in this regard, as in other implementations a mixer may directly downconvert an incoming RF signal to baseband. Note that the pre-mixed RF signal (represented by numeral (1) at the output of VGA 215) may be fed to a peak detector 220 to enable peak detection of the signal. In other embodiments peak detection may be performed based on the signal present after mixer 230. This detection signal may be provided as an input to AGC controller 260, which may use the information in determining an appropriate level for controlling VGA 215.

In various embodiments, AGC controller 260 may use the information from peak detector 220 to appropriately set $\alpha_A$ to optimize noise and linearity in both mixer 230 as well as an ADC 235 coupled to an output of mixer 230. Thus the gain value may be set to optimize the dynamic range of ADC 235. In various implementations, the setting of $\alpha_A$ may be performed on initial tuning to a given channel. In ideal operation, there may be no need to change this analog gain control value after the initial setting, as the control steps may be discrete in nature. That is, while described as an analog control signal since one or more analog gain blocks may be controlled using the control value $\alpha_A$ (and/or additional control values provided from AGC controller 260), in some implementations the actual control value may be a digital control word that is used to, e.g., switch various amounts of gain blocks into the signal path.

As described above, in ideal conditions the value of $\alpha_A$ would not change after initial setting to a given channel. Instead, any fine adjustments to gain may be implemented via digital control in an automatic volume control (AVC) circuit 270, as will be described further below. However, changes in the incoming signal, e.g., due to antenna movement or other reasons may cause the incoming signal to change to a level where the analog control signal may need to be adjusted to maintain desired performance. That is, a change may be needed to prevent clipping, reduce output noise or prevent other undesired effects. Accordingly, in these instances $\alpha_A$ may be adjusted by AGC controller 260 during normal operation. Such a change may therefore cause an instantaneous gain change which could lead to undesirable audible artifacts.

Accordingly, to reduce or prevent such audible artifacts, embodiments may use a gain change compensation circuit 250. As shown in FIG. 3, gain change compensation circuit 250 is coupled to receive a control signal, $G_{LD}$, which may be a compensation signal from AGC controller 260, and process this signal to provide an output to a multiplier 240 of the signal processing path which is coupled to an output of ADC 235. Multiplier 240 then multiplies the baseband complex signal with a gain change compensation value to thus generate a compensated baseband signal (at reference numeral (2)) that is provided for signal processing, e.g., in a DSP.

As part of the DSP or separately, an AVC circuit 270 may be present to receive this baseband signal, which may be gain change compensated in cases of instantaneous gain changes. AVC circuit 270 may be used to perform finer gain control changes during normal operation. Specifically, a multiplier 274 is coupled to receive the incoming signal and a digital gain control signal, $\alpha_D$, which may also be generated by AGC controller 260. AGC controller 260 may generate $\alpha_D$ based on an estimated power of the output from multiplier 274 as determined by a power estimator 276. The output of multiplier 274 may be at a substantially constant carrier power (represented in FIG. 3 as reference numeral (3)), and which may be further processed to obtain a demodulated signal. In various embodiments, power estimator 276 may include a narrowband filter that is closely configured around a carrier frequency of the incoming signal. Power estimator 276 may measure the output power, which may be a measure of the carrier power. Based on this level, AGC controller 260 may provide $\alpha_D$ to multiplier 274 to adjust the output to a desired reference level in a continuous and relatively slow manner. In normal operation, $\alpha_D$ may be changed continuously (i.e., within a numerical precision of the digital circuitry) and slowly enough to reduce audible artifacts below a desired level.

When a change is needed to be made to $\alpha_A$, AGC controller 260 will provide the new value to VGA 215, leading to an instantaneous change in the gain level. The change to $\alpha_A$ may correspond to:

$$\Delta \alpha_A = \frac{\alpha_{AF}}{\alpha_{AI}} \qquad [1]$$

where $\alpha_{AF}$ is the final $\alpha_A$ setting, and $\alpha_{AI}$ is the original $\alpha_A$ setting (prior to the change). Because this change may cause an almost instantaneous gain step in the signal which may lead to an audible artifact, gain change compensation circuit 250 may be used to remove this instantaneous gain change.

Specifically, when AGC controller 260 provides the new $\alpha_A$, it may also provide a corresponding compensation signal, $G_{LD}$, to gain compensation circuit 250. This compensation signal may be set at a non-zero value and may be provided for, in one embodiment, a single sampling cycle of receiver 200. In one embodiment, this compensation signal may correspond to:

$$1 + G_{LD} = \frac{1}{\Delta \alpha_A} = \frac{\alpha_{AI}}{\alpha_{AF}} \qquad [2]$$

$$\text{Thus,} \quad G_{LD} = \frac{\alpha_{AI}}{\alpha_{AF}} - 1 \qquad [3]$$

Thus based on the initial and final values of $\alpha_A$, the compensation signal may be provided to gain change compensation circuit 250, and more particularly to an adder 252. In turn, adder 252 is coupled to a delay element 254 having an output provided to a second adder 256, which may add a constant value, e.g., a constant one value to the gain change control signal ($\alpha_{GCC}$) output by delay element 254. This output of second adder 256 may be provided as a gain compensation value to multiplier 240.

Note further that a feedback loop from delay element 254 is provided to a multiplier 258, which may slowly decay this output of delay element 254 and provide the decayed result as an input to adder 252. A filter which may be a low pass filter (LPF) may be composed of adder 252, multiplier 258 which scales the output of delay element 254 and generates the feedback term into adder 252, and delay element 254 which delays the output of adder 252 by one processing cycle and provides the output of the filter. The value of delay element 254 is referred to as the state variable of the filter. More specifically, the LPF is driven with an impulse and its response is a step followed by an exponential decay to zero. In other embodiments, a high pass filter may be used with the input provided with a step.

In various implementations, the gain compensation value generated by gain change compensation circuit 250 may be inversely proportional to the gain change caused by the change to $\alpha_A$. For example, a change to $\alpha_A$ which leads to a doubling of the output of VGA 215 may engender a gain compensation value of 0.5 to be provided to multiplier 240.

Thus, gain change compensation circuit 250 may act to low pass filter the compensation signal, $G_{LD}$, from AGC controller 260, as a decay rate (i.e., $\lambda$) may be set at a value slightly less than one (e.g., approximately 0.99, in one embodiment) such that the ramp is sub-audible. This decay rate may be based on the update rate in the filter which decays the state variable. In one such embodiment, the update rate may be 32 kHz, and a decay rate of 0.99 may be used, which provides for a 50 Hz bandwidth on the filter, or a λ of about 3.2 milliseconds. As described further below, this rate should be slower than the tracking bandwidth of an associated automatic volume control circuit.

Thus, $\alpha_{GCC}$ may immediately follow $G_{LD}$, as delay element 254 may act as a single element delay that will slowly decay to zero, based on the value of λ. In this way, an instantaneous front end gain change step may be completely removed by the compensation provided through multiplier 240 and gain change compensation circuit 250. Then, slowly at a rate set by λ, the actual analog gain change may pass through to AVC circuit 270. Note that during operation in the absence of an instantaneous gain change, gain change compensation circuit 250 may be inactive, as $G_{LD}$ may be fixed at a zero value, and thus the output of gain change compensation circuit 250 to multiplier 240 remains at a steady state logic one value, representing the constant one value input into second adder 256.

The following is an example illustration of how an instantaneous gain change may be tracked out via gain change compensation circuit 250. Assume that an initial value for the analog gain control is set at two (i.e., $\alpha_{AF}=2$). Because of changes in the channel or another reason, the analog gain control may be adjusted to a level of four (i.e., $\alpha_{AF}=4$). This instantaneous gain change may thus cause the output of VGA 215 to instantaneously change to double its initial value. To avoid an audible artifact as a result, gain change compensation circuit 250 may be provided an input compensation signal $G_{LD}$ equal to −0.5 (as determined in accordance with Equation 3). $G_{LD}$ may be delayed by the group delay between VGA 215 and multiplier 240. Accordingly, the instantaneous gain change control value $\alpha_{GCC}$ is equal to −0.5, which in turn is added to the constant value of 1 in adder 256 to obtain a gain compensation value of 0.5 that is provided to multiplier 240. Accordingly, the output of multiplier 240 is at its instantaneous value the same as prior to the gain change. The delay caused by gain change compensation circuit 250 thus slowly allows the gain change of the output from VGA 215 to pass through multiplier 240 at its intended level. Similar operation can occur in reverse in instances when the analog gain control signal is reduced. In these instances, the compensation signal, $G_{LD}$, may initially be set at a positive value which is then decayed to slowly allow the full analog gain change to pass through the signal processing path.

While shown with this particular implementation in the embodiment of FIG. 3, understand the scope of the present invention is not limited in this regard. That is, while FIG. 3 shows a hardware-based implementation for ease of discussion, gain change compensation circuit 250, AGC circuit 270, along with AGC controller 260 may be implemented in code that executes on a DSP or other processor. As such, gain change compensation circuit 250 may be implemented along with AGC controller 260 within a DSP of a receiver that enables digital control of both analog and digital gain blocks within a signal processing path of a receiver. To that end, embodiments may include an article in the form of a computer-readable medium onto which instructions are written. These instructions may enable the DSP or other programmable processor to perform gain change compensation and automatic volume control in accordance with an embodiment of the present invention.

While shown at this particular location within the signal processing path, it is to be understood that gain change compensation circuit 250 may be located at various places in other embodiments. In some embodiments, the gain change compensation technique may be performed as early as possible in the single processing path. In this way, any artifacts that may affect other portions of the single processing path may be reduced. Further, control of gain change compensation circuit 250 may vary depending on its location, as the time until $G_{LD}$ is non-zero may be controlled to match the group delay of signal processing occurring between VGA 215 and gain change compensation circuit 250.

Figure 4:
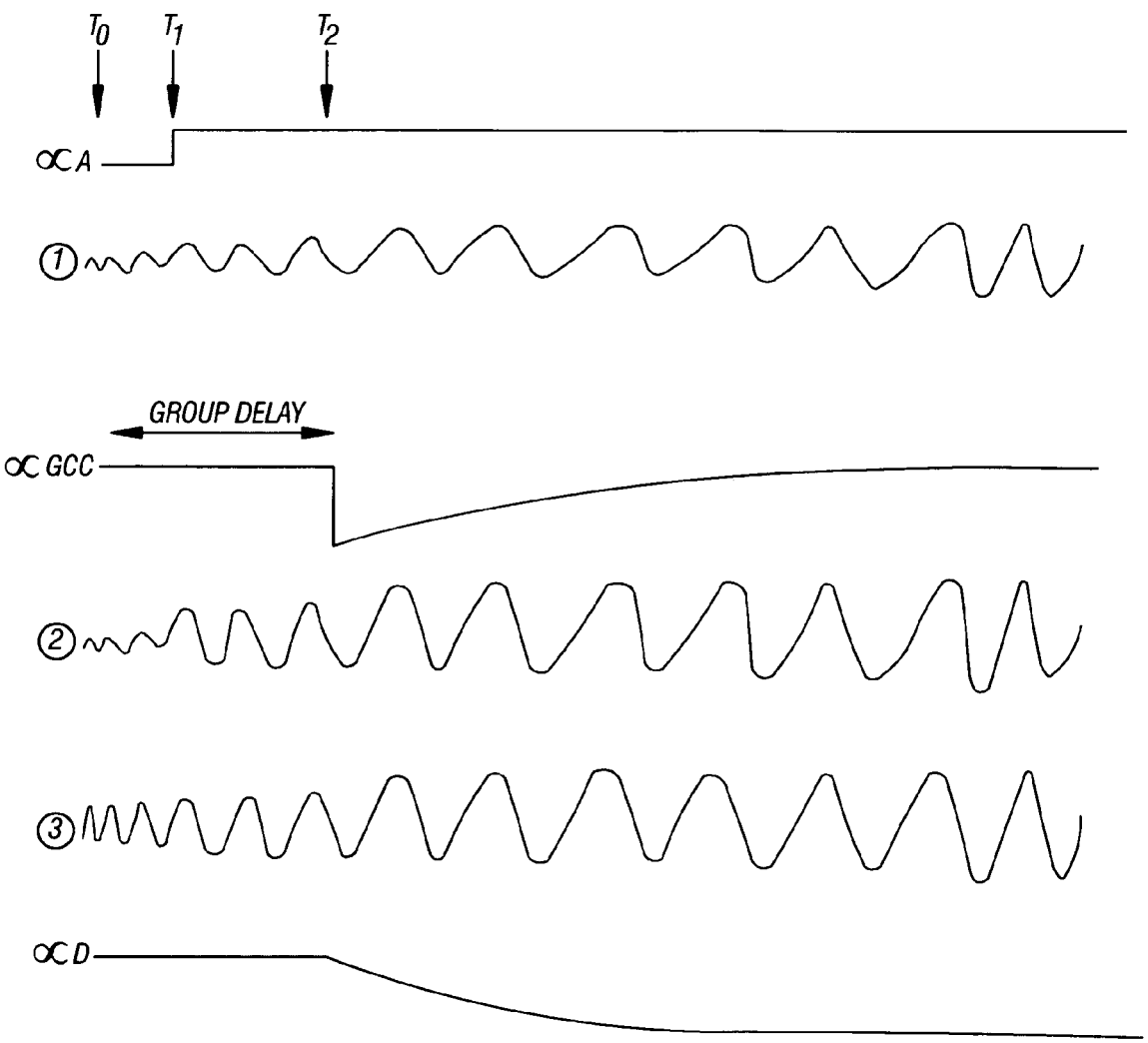
FIG. 4 is a timing diagram of operation of a method in accordance with an embodiment of the present invention.

Using an implementation such as that shown in FIG. 3, artifacts or other undesired noise that may occur as a result of an instantaneous analog gain change may be removed. Referring now to FIG. 4, shown are timing diagrams of signal levels at various portions within the signal processing path of FIG. 3. As shown in FIG. 4, the analog gain control value, $\alpha_A$, may initially begin at a first level at a time T0. At a later time, T1, an instantaneous gain change increases $\alpha_A$ to a second level. Accordingly, at the output of VGA 215, as represented by the numeral 1 in FIG. 3, the amplitude of the RF signal is instantaneously increased. Using a gain change compensation technique in accordance with an embodiment of the present invention, however, the output of delay element 254, $\alpha_{GCC}$, which is initially at a value of, e.g., 0, is instantaneously changed at a time T2 to a (e.g., negative) value based on the input of a non-zero compensation value, $G_{LD}$, into gain change compensation circuit 250. Note that the time difference between T1 and T2 may correspond to a group delay between VGA 215 and multiplier 240. Note further that the $\alpha_{GCC}$ signal then decays back to its original value of zero slowly over time. By imposition of the gain change compensation value into the signal processing path, the instantaneous gain change present in the output of VGA 215 is thus removed, as reflected in FIG. 4 at waveform 2, which corresponds to an output of multiplier 240 of FIG. 3. Note that after imposition of the gain compensation signal, waveform 2 increases slowly over time. This change may then be tracked out digitally, e.g., via AVC circuit 270 such that the output of AVC circuit 270, as represented by numeral 3 in FIG. 3, is at a substantially constant gain level. Thus the digital gain control value, $\alpha_D$, slowly is lowered over time, as shown in FIG. 4.

Note that the value of λ (in gain change compensation circuit 250) may be chosen such that the speed of the volume change occurring at the output of multiplier 240 may be within the tracking rate of AVC circuit 270. In this way, the digital gain control value, $\alpha_D$, may vary so as to maintain the output power at a substantially constant value, thus reducing or removing any audible artifact to an end user.

Note that in some embodiments, the bandwidth of AVC circuit 270 may be temporarily increased during an instantaneous gain change to allow the gain compensation to occur in a more rapid manner. This bandwidth adjustment may occur when gain change compensation circuit 250 is active. In this way, $\alpha_{GCC}$ may decay to zero more rapidly. In one such embodiment, upon an instantaneous analog gain change, AGC controller 260 may cause a low pass filter of power estimator 276 to be widened. In this way, a more instantaneous power value may be received by AGC controller 260. When the gain change compensation value then decays to zero, the low pass filter may be reset back to a more narrow band.

Figure 5:
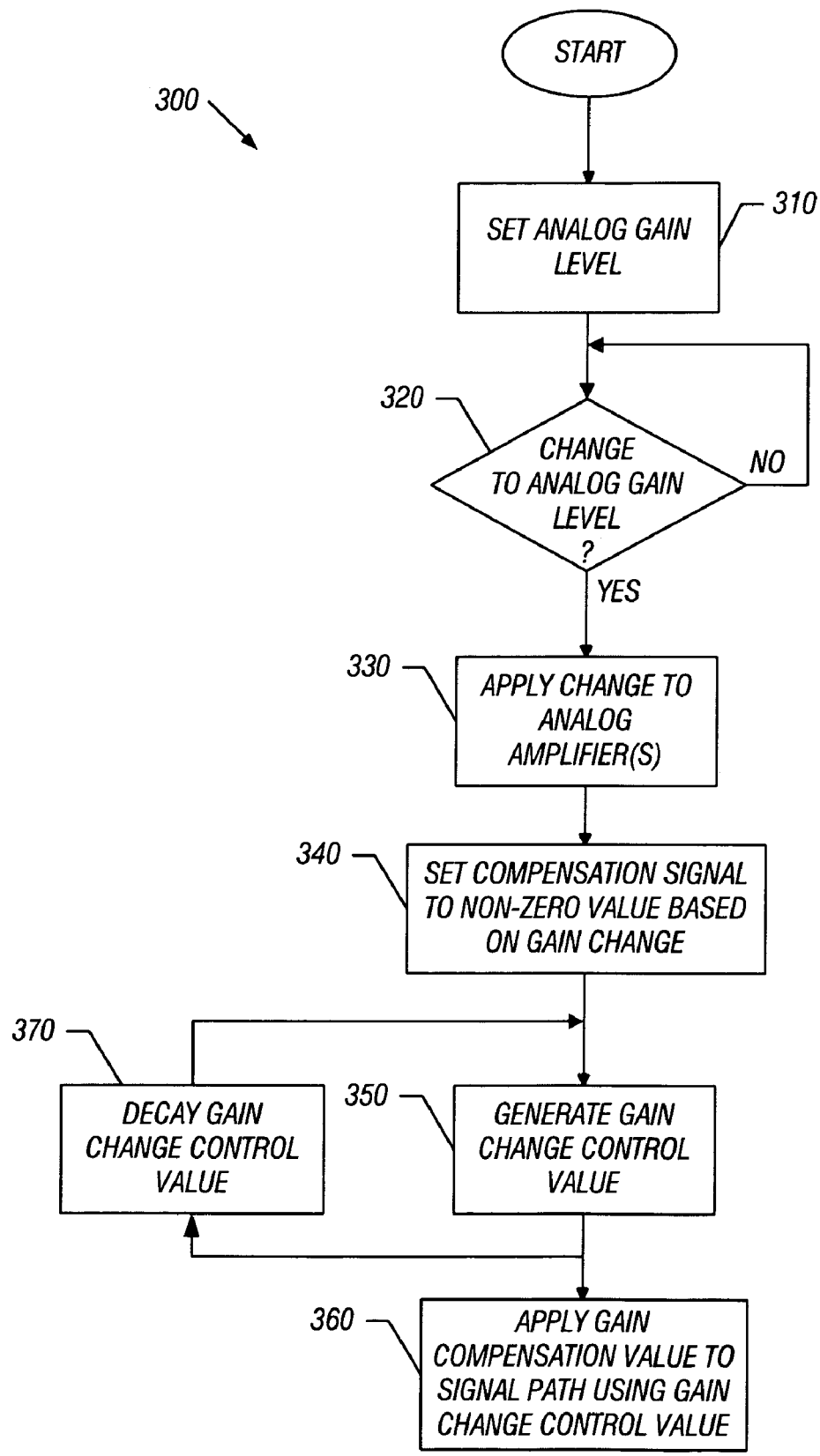
FIG. 5 is a flow diagram of a method in accordance with one embodiment of the present invention.

Referring now to FIG. 5 shown is a flow diagram of a method in accordance with one embodiment of the present invention. Specifically, FIG. 5 is a flow diagram that shows an exemplary method of gain compensation that may be implemented in a DSP. As shown in FIG. 5, method 300 may begin by setting an analog gain level (block 310). Such analog gain level may be set, e.g., upon initial tuning to a desired channel. Then during normal operation it may be determined whether a change to the analog gain level is needed (diamond 320). Such a change may be necessitated if finer gain control, e.g., of digital gain blocks cannot compensate for changes in the channel. If no such change occurs, diamond 320 may loop back on itself. If instead such a change is effected to the analog control, block 330 is encountered.

At block 330, a change may be applied to one or more analog amplifiers. Specifically, gain control values for the analog amplifiers may be adjusted accordingly. Then, a compensation signal may be set to a non-zero value based on the gain change (block 340). More specifically, a compensation signal derived based on the original and final analog control values may be generated and provided for a single sampling cycle of the receiver. From this compensation signal, a gain change control value may be generated (block 350). With reference back to FIG. 3, gain change compensation circuit 250 may generate $\alpha_{GCC}$ based on the non-zero input of the compensation signal. Using this gain change control value, a gain compensation value may be applied to the signal path (block 360). For example, still referring back to FIG. 3, second adder 256 may add a constant one value to the gain change control value, the output of which is then provided to multiplier 240 to thus cause the instantaneous output of multiplier 240 to be without the instantaneous gain change present at its input.

Referring still to FIG. 5, note that the gain change control value may be decayed (block 370). Specifically, the feedback loop in gain change compensation circuit 250 may slowly decay this value until the gain change control value returns to its initial zero value. In this way, the analog control change may be slowly allowed to pass through the signal processing path, since at slowly adjusting levels, later digital gain blocks may account for the gain changes. Thus after some number of iterations (of blocks 350, 360, and 370), the full analog gain change may thus pass through the front end of a receiver. While shown with this particular implementation in the embodiment of FIG. 5, understand the scope of the present invention is not limited in this regard.

Referring to FIG. 6, in accordance with some embodiments of the invention, the multimode transceiver 10 may be part of a multimedia portable wireless device 410, which, in turn, is part of a wireless system 400. As examples, the wireless device 410 may be a dedicated MP3 player, a cellular telephone or PDA with the capability of playing music downloads, part of a wireless link between a satellite antenna and a radio receiver, a terrestrial receiver, etc.

Among its other various functions, the wireless device 410 may store digital content on a storage 430, which may be a flash memory or hard disk drive, as a few examples. The wireless device 410 generally includes an application subsystem 460 that may, for example, receive input from a keypad 462 of the wireless device 410 and display information on a display 470. Furthermore, the application subsystem 460 may generally control the retrieval and storage of content from the storage 430 and the communication of, e.g., audio with the multimode transceiver 10. As shown, the multimode transceiver 10 may be directly connected to speakers 440 and 450 for output of audio data. As depicted in FIG. 6, the multimode transceiver 10 may be coupled by a matching network 434 to a receiver antenna 480 and may be coupled by a matching network 432 to the transmit antenna 482.

Although the wireless device 410 may include the speakers 440 and 450, it may be desirable to play sounds that are generated by the wireless device 410 over a more sophisticated speaker system. Therefore, in accordance with some embodiments of the invention, the wireless device 410, via the multimode transceiver 10, may broadcast content to be played over an FM channel to the receiver of an adjacent stereo system 500 (as an example). As shown, the stereo system 500 includes an RF antenna 504 for purposes of receiving the transmitted content from the wireless device 410.

In accordance with some embodiments of the invention, the wireless device 410 may have the ability to communicate over a communications network, such as a cellular network. For these embodiments, the wireless device 410 may include a baseband subsystem 475 that is coupled to the application subsystem 460 for purposes of encoding and decoding baseband signals for this wireless network. Baseband subsystem 470 may be coupled to a transceiver 476 that is connected to corresponding transmit and receive antennas 477 and 478.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a front end amplifier to adjust a level of an incoming radio signal;
an analog-to-digital converter (ADC) coupled to the front end amplifier to digitize the incoming radio signal and provide the digitized incoming radio signal to a signal path; and
a gain compensation input coupled to the signal path to provide a gain change compensation signal received from a gain change compensation circuit to remove a level change present in the incoming radio signal after a change to a control value for the front end amplifier received from a controller, wherein the gain change compensation circuit includes a gain compensation path coupled to the gain compensation input, the gain compensation path including a first summer to sum a compensation signal with a feedback signal, a delay element coupled to an output of the first summer, and a second summer coupled between an output of the delay element and the gain compensation input.

2. The apparatus of claim 1, further comprising a multiplier to generate the feedback signal coupled between the output of the delay element and the first summer.

3. The apparatus of claim 1, wherein the controller is to generate the control value for the front end amplifier and the compensation signal.

4. The apparatus of claim 3, wherein the controller is to generate the compensation signal for a sampling cycle of the incoming radio signal.

5. The apparatus of claim 4, wherein the gain change compensation signal is to decay over a predetermined time.

6. The apparatus of claim 1, further comprising a multiplier to combine the digitized incoming radio signal and the gain change compensation signal.

7. The apparatus of claim 6, wherein the controller is to provide the control value to the front end amplifier and a second control value to a digital amplifier coupled to the multiplier.

8. The apparatus of claim 7, further comprising a power detector to estimate a power level of an output of the digital amplifier.

9. The apparatus of claim 8, wherein the controller is to adjust a bandwidth of the power detector when the gain change compensation signal is present.

10. A method comprising:
generating a control value in a gain controller for an analog amplifier of a receiver;
injecting a gain compensation value from a gain change compensation circuit into a signal path of the receiver for a predetermined time when a change to the control value for the analog amplifier occurs, the gain compensation value to at least substantially remove a gain change caused by the change to the control value; and
controlling the gain compensation value from an initial value to a predetermined final value at which the gain change propagates along the signal path to a digital gain block.

11. The method of claim 10, further comprising providing a compensation signal to a filter and generating the gain compensation value based on an output of the filter.

12. The method of claim 11, further comprising decaying an output of the filter and providing the decayed output to the filter.

13. The method of claim 11, further comprising providing the compensation signal for a sampling cycle of the receiver.

14. An integrated circuit comprising:
a first amplifier to receive a radio frequency (RF) signal, the first amplifier controlled by a first control value;
a digitizer to digitize an output of the first amplifier;
a gain compensation circuit to generate a compensation value having an inversely proportional relationship to a change to the first control value, the compensation value based on a compensation signal provided for a single sampling cycle of the RF signal; and
a combiner to combine the outputs of the digitizer and the compensation value.

15. The integrated circuit of claim 14, further comprising a second amplifier coupled to an output of the combiner, the second amplifier controlled by a second control value.

16. The integrated circuit of claim 15, wherein the second amplifier comprises a digital amplifier to output a signal at a substantially constant volume.

17. The integrated circuit of claim 15, further comprising a controller to generate the first control value and the second control value, the controller to further provide the compensation signal to the gain compensation circuit.

18. The integrated circuit of claim 17, wherein the controller is to provide the compensation signal for a predetermined time after a change to the first control value.

19. A system comprising:
a receiver to receive an amplitude modulated (AM) signal, the receiver including:
a first amplifier to amplify the AM signal, the first amplifier controlled by a first control value;
a mixer to downconvert the AM signal to a second frequency signal;
a digitizer to digitize the second frequency signal;
a gain compensator to generate a compensation value based on a change to the first control value and including a first summer to sum a compensation signal with a feedback signal, a delay element coupled to an output of the first summer, and a second summer coupled between an output of the delay element and a combiner;
the combiner to combine the outputs of the digitizer and the gain compensator; and
an automatic volume controller (AVC) to receive the combiner output and provide an output signal at a substantially constant volume; and
an output device to output the output signal.

20. The system of claim 19, wherein the AVC comprises:
a multiplier to receive the combiner output and a second control value and to output the output signal at the substantially constant volume; and
a power estimator coupled to an output of the multiplier to estimate a power level of the AM signal, the power estimator including a filter having an adjustable bandwidth, wherein the bandwidth is to be widened when the gain compensator is active.

21. The system of claim 19, further comprising a digital signal processor including the gain compensator and the AVC.

22. The system of claim 19, wherein the system comprises a portable device having an integrated circuit (IC) including the receiver, wherein the receiver is controlled to receive the AM signal or a frequency modulation (FM) signal.

23. The system of claim 19, wherein the system includes a storage to a store a first code portion to perform signal processing in a digital signal processor of the system in an AM mode and a second code portion to perform signal processing in the digital signal processor in an FM mode based on user control.

* * * * *